United States Patent
Ellä

(10) Patent No.: US 6,204,737 B1
(45) Date of Patent: Mar. 20, 2001

(54) PIEZOELECTRIC RESONATOR STRUCTURES WITH A BENDING ELEMENT PERFORMING A VOLTAGE CONTROLLED SWITCHING FUNCTION

(75) Inventor: Juha Ellä, Halikko (FI)

(73) Assignee: Nokia Mobile Phones, Ltd, Espoo (FI)

( * ) Notice: Subject to any disclaimer, the term of this patent is extended or adjusted under 35 U.S.C. 154(b) by 0 days.

(21) Appl. No.: 09/321,058

(22) Filed: May 27, 1999

(30) Foreign Application Priority Data

Jun. 2, 1998 (FI) .................................................. 981245
Jun. 18, 1998 (FI) ................................................. 981415

(51) Int. Cl.[7] .............................. H03H 9/15; H03H 9/48; H03H 9/70; H03H 9/54
(52) U.S. Cl. ......................... 333/187; 333/188; 333/189; 333/101; 333/133; 310/321
(58) Field of Search ................................... 333/101, 133, 333/187, 188, 190, 189, 191, 192; 310/321

(56) References Cited

U.S. PATENT DOCUMENTS

| | | | |
|---|---|---|---|
| 4,692,727 | 9/1987 | Wakino et al. | 333/219 |
| 5,057,801 | 10/1991 | Kittaka et al. | 333/187 |
| 5,260,596 | * 11/1993 | Dunn et al. | 257/414 |
| 5,373,268 | 12/1994 | Dworsky et al. | 333/187 |
| 5,382,930 | 1/1995 | Stokes et al. | 333/191 |
| 5,446,306 | 8/1995 | Stokes et al. | 257/416 |
| 5,596,239 | 1/1997 | Dydyk | 310/311 |
| 5,696,491 | * 12/1997 | White et al. | 340/657 |
| 5,714,917 | 2/1998 | Ella | 332/144 |
| 5,872,493 | 2/1999 | Ella | 333/191 |
| 5,873,154 | 2/1999 | Ylilammi et al. | 29/25.35 |
| 6,049,702 | * 4/2000 | Tham et al. | 455/78 |

FOREIGN PATENT DOCUMENTS 0 155 145 A3   9/1985   (EP) .
0 834 989 A3   4/1998   (EP) .

OTHER PUBLICATIONS

"Acoustic Bulk Wave Composite Resonators", Applied Physics Letters, Lakin et al., vol. 38, No. 3, pp. 125–127, Feb. 1, 1981.

"An Air–Gap Type Piezoelectric Composite Thin Film Resonator", Satoh et al., I5 Proc. 39th Annual Symp. Freq. Control, pp. 361–366, 1985.

"Ferroelectric Thin Films in Microelectromechanical Systems Applications", Polla et al. MRS Bulletin, Jul. 1996, pp. 59–65.

Finnish Search Report 981415, May 12, 1999.
Finnish Search Report 981245, May 12, 1999.

* cited by examiner

Primary Examiner—Benny Lee
Assistant Examiner—Barbara Summons
(74) Attorney, Agent, or Firm—Perman & Green, LLP (57) ABSTRACT

The invention relates to resonator structures of radio communication apparatus. According to the invention, a micromechanical switch and a resonator are realized in a single combined structure. Combination of switch and resonator structures allows the manufacture of very compact filter and resonator structures needed for multi-system mobile communication means.

7 Claims, 9 Drawing Sheets

PIEZOELECTRIC RESONATOR STRUCTURES WITH A BENDING ELEMENT PERFORMING A VOLTAGE CONTROLLED SWITCHING FUNCTION

TECHNICAL FIELD OF THE INVENTION

The invention relates to resonator structures of radio communication apparatus.

BACKGROUND OF THE INVENTION

The development of mobile telecommunications continues towards ever smaller and increasingly complicated handheld units. The development has recently lead to new requirements for handheld units, namely that the units should support several different standards and telecommunications systems. Supporting several different systems requires several sets of filters and other RF components in the RF parts of the handheld units. Despite this complexity, the size of a handheld unit should not increase as a result of such a wide support.

The RF filters used in prior art mobile phones are usually discrete surface acoustic wave (SAW) or ceramic filters. This approach has been adequate for single standard phones, but does not allow support of several telecommunications systems without increasing the size of a mobile phone.

Figure 1:
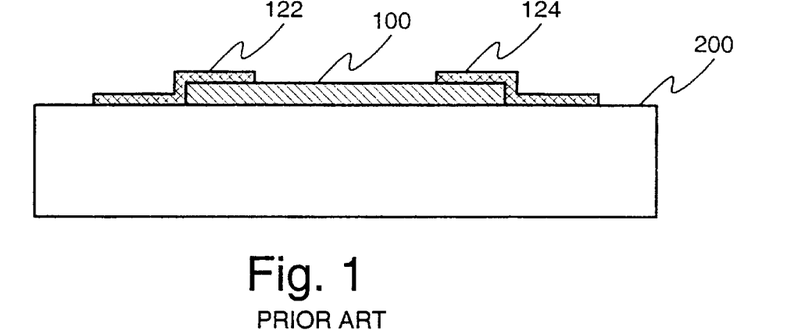
FIG. 1 illustrates a surface acoustic resonator according to prior art.

Surface acoustic wave (SAW) resonators typically have a structure similar to that shown in FIG. 1. Surface acoustic resonators utilize surface acoustic vibration modes of a solid surface, in which modes the vibration is confined to the surface of the solid, decaying quickly away from the surface. A SAW resonator typically comprises a piezoelectric layer 100, and two electrodes 122, 124. Various resonator structures such as filters are produced with SAW resonators. A SAW resonator has the advantage of having a very small size, but unfortunately cannot withstand high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125–127, Feb. 1, 1981, by K. M. Lakin and J. S. Wang, an acoustic bulk wave resonator is disclosed which comprises a thin film piezoelectric layers of zinc oxide (ZnO) sputtered over a thin membrane of silicon (Si). Further, in an article entitled "An Air-Gap Type Piezoelectric Composite Thin Film Resonator", 15 Proc. 39th Annual Symp. Freq. Control, pp. 361–366, 1985, by Hiroaki Satoh, Yasuo Ebata, Hitoshi Suzuki, and Choji Narahara, a bulk acoustic wave resonator having a bridge structure is disclosed.

Figure 2:
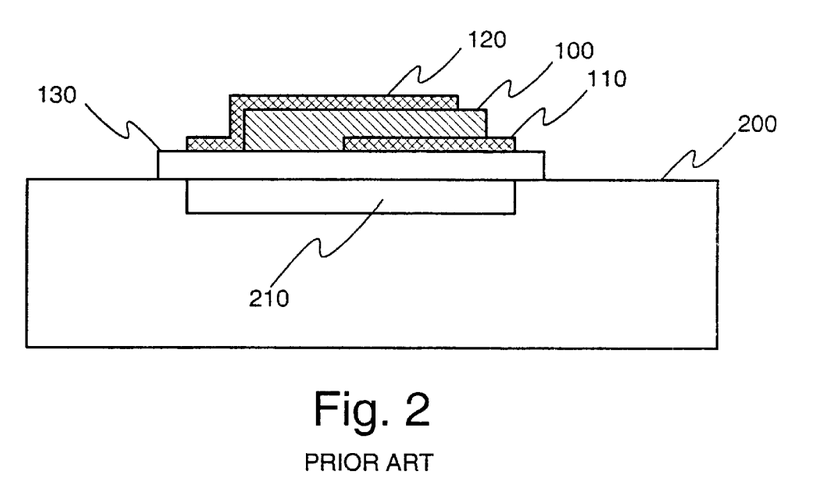
FIG. 2 illustrates a bulk acoustic wave resonator according to prior art.

FIG. 2 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away a sacrificial layer. The gap serves as an acoustic isolator, essentially isolating the vibrating resonator structure from the substrate.

Bulk acoustic wave resonators are not yet in widespread use, partly due to the reason that feasible ways of combining such resonators with other circuitry have not been presented. However, BAW resonators have some advantages as compared to SAW resonators. For example, BAW structures have a better tolerance of high power levels.

Figure 3:
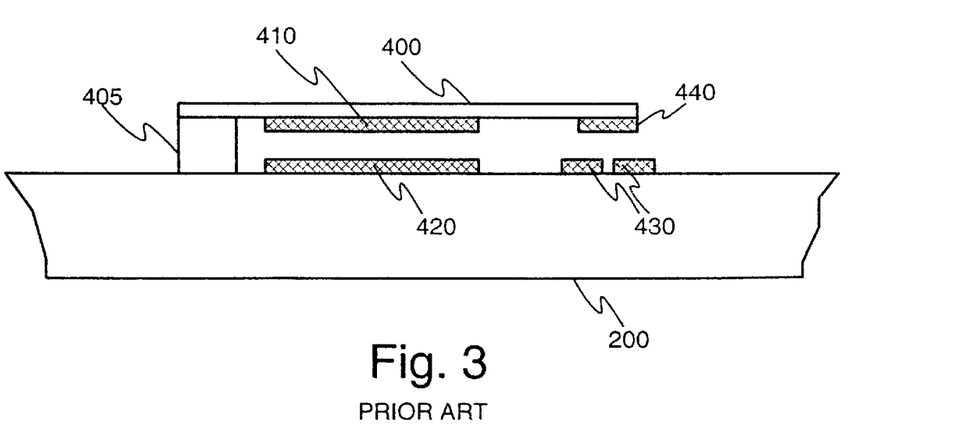
FIG. 3 illustrates a micromechanical switch structure according to prior art.

Micromechanical devices are also presently under development. A micromechanical device is created typically on silicon substrates using deposition, patterning and etching techniques to create the desired structure. As an example, FIG. 3 illustrates the structure of a micromechanical switch. A micromechanical switch comprises a cantilever 400, contact pads 430 on the substrate 200 and a contacting bar 440 for creating a contact between the contact pads 430, and two electrodes 410, 420. The cantilever electrode 410 is formed on the cantilever and the substrate electrode 420 on the substrate. The contacting bar is formed at one end of the cantilever, and the other end of the cantilever is fixed to the substrate, preferably with a support 405 in order to raise the cantilever away from the substrate surface. The micromechanical switch is operated with a DC voltage coupled between the cantilever and substrate electrodes. The DC voltage creates an electrostatic force between the cantilever and substrate electrodes of the switch. The electrostatic force bends the cantilever, bringing the contacting bar into contact with the substrate contact pads 430. Various other micromechanical structures are disclosed in an article entitled "Ferroelectric Thin Films in Microelectromechanical Systems Applications", MRS Bulletin, Jul. 1996, pp. 59–65, by D. L. Polla and L. F. Francis, and references contained therein.

SUMMARY OF THE INVENTION

An object of the invention is to provide switched resonator structures. A further object of the invention is to provide such structures having a very small size. An object of the invention is also to decrease the size of filter structures required for multi-system mobile communication means.

The objects are reached by combining the resonator elements and the switch elements in the same structure.

The resonator structure according to the invention is characterized by that, which is specified in the characterizing part of the independent claim directed to a resonator structure. The mobile communication means according to the invention is characterized by that, which is specified in the characterizing part of the independent claim directed to a mobile communication means. The dependent claims describe further advantageous embodiments of the invention.

According to the invention, a micromechanical switch and a resonator are realized in a single combined structure. Combination of switch and resonator structures allows the manufacture of very compact filter and resonator structures needed for multi-system mobile communication means.

BRIEF DESCRIPTION OF THE DRAWINGS

The invention is described in more detail in the following with reference to the accompanying drawings, of which

Same reference numerals are used for similar entities in the figures.

DETAILED DESCRIPTION

In the following, certain types of BAW resonators are first described, which BAW resonators are advantageously used in structures according to the invention.

Bulk acoustic wave resonators are typically fabricated on silicon (Si), gallium arsenide (GaAs), glass, or ceramic substrates. One further ceramic substrate type used is alumina. The BAW devices are typically manufactured using various thin film manufacturing techniques, such as for example sputtering, vacuum evaporation or chemical vapour deposition. BAW devices utilize a piezoelectric thin film layer for generating the acoustic bulk waves. The resonance frequencies of typical BAW devices range from 0.5 Ghz to 5 Ghz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:
an acoustically active piezoelectric layer,
electrodes on opposite sides of the piezoelectric layer, and
acoustical isolation from the substrate.

The piezoelectric layer may be for example, ZnO, AlN, ZnS or any other piezoelectric material that can be fabricated as a thin film. As a further example, also ferroelectric ceramics can be used as the piezoelectric material. For example, $PbTiO_3$ and $Pb(Zr_xTi_{1-x})O_3$ and other members of the so called lead lanthanum zirconate titanate family can be used.

Preferably, the material used to form the electrode layers is an electrically conductive material having a high acoustic impedance. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta).

The acoustical isolation can be produced with for example the following techniques:
with a substrate via-hole,
with a micromechanical bridge structure, or
with an acoustic mirror structure.

However, the invention is not limited to these three techniques, since any other way of isolating the resonator from the substrate can be used as well.

In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure.

Figure 4:
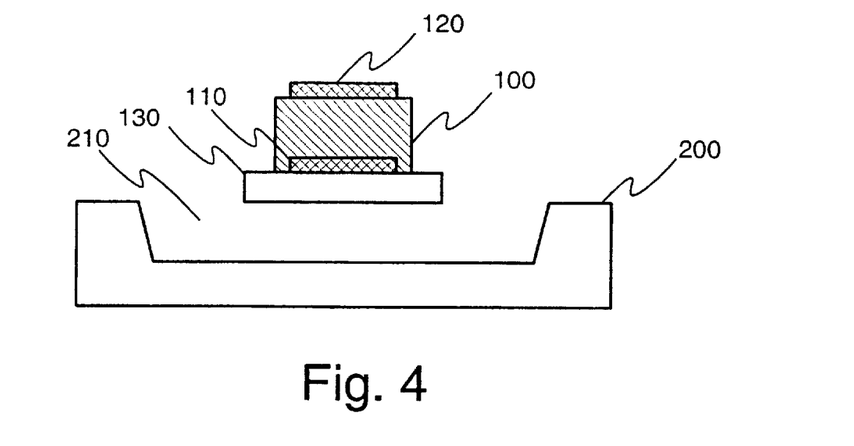
FIG. 4 shows a sectional view of a bulk acoustic wave resonator having a bridge structure.
Figure 5:
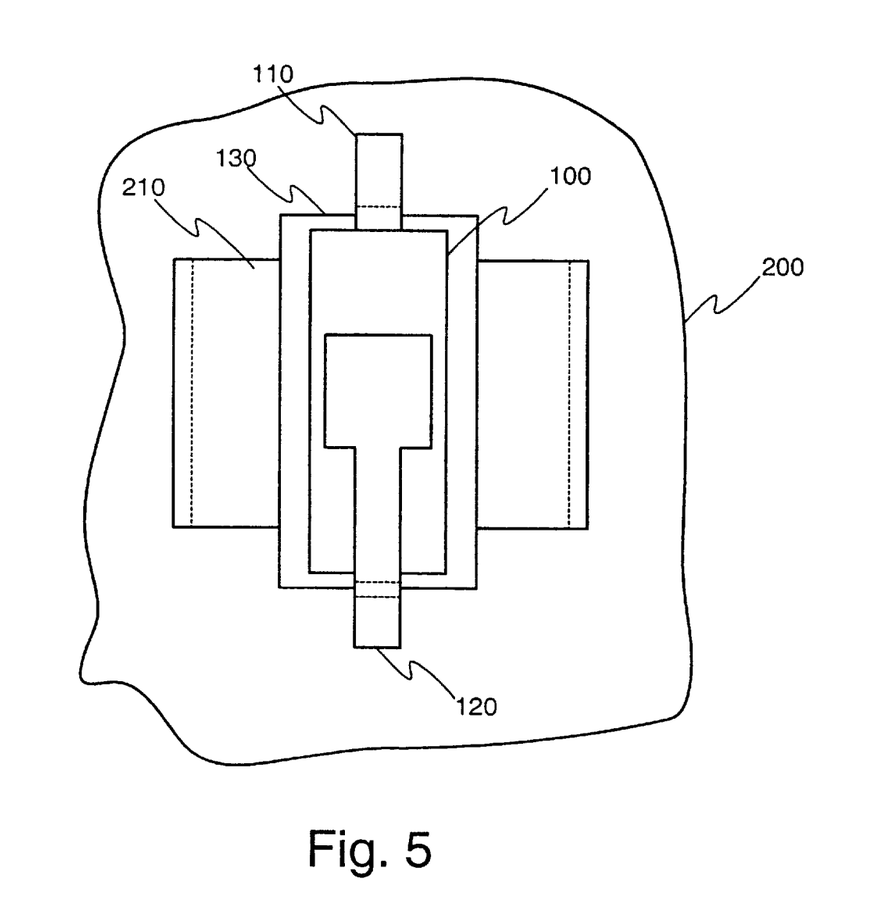
FIG. 5 shows a top view of the structure in FIG. 4.

Bridge structures can be realized, for example, using an etch pit structure. FIGS. 4 and 5 illustrate a BAW with an etch pit structure. FIGS. 4 and 5 show the substrate 200, a membrane layer 130, the bottom electrode 110, the piezoelectric layer 100, and the top electrode 120. FIG. 4 presents a sectional view of the structure, while FIG. 5 shows a top view of the structure. In the etch pit structure, the etch pit 210 is etched under the BAW structure after deposition of at least the membrane layer 130.

Figure 6:
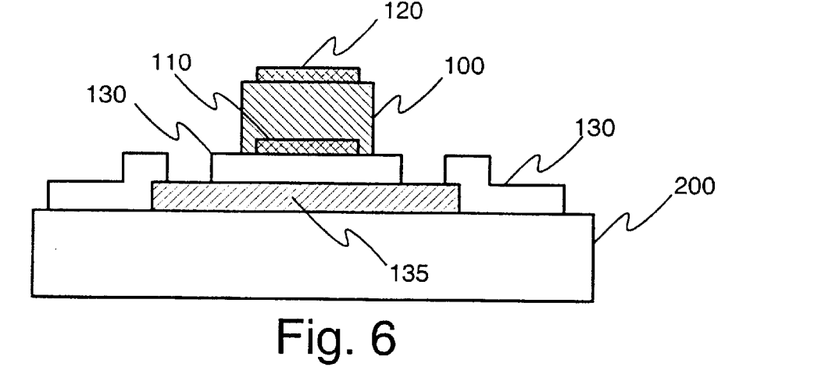
FIG. 6 shows another bulk acoustic wave resonator structure having a bridge structure.

FIG. 6 illustrates another way of producing a bridge structure. Before the deposition of other layers of the BAW structure, a sacrificial layer 135 is deposited and patterned first. The rest of the BAW structure is deposited and patterned partly on top of the sacrificial layer 135. After the rest of the BAW structure is completed, the sacrificial layer 135 is etched away. FIG. 6 shows also the substrate 200, a membrane layer 130, the bottom electrode 110, the piezoelectric layer 100, and the top electrode 120.

The sacrificial layer is preferably realized using a metal or a polymer as the material. For example, the sacrificial layer may be produced using copper (Cu) as the material. The polymer is preferably such a polymer, which can withstand the relatively high temperatures, that can be reached during the deposition of the other layers. The polymer may be, by example, polytetrafluoroethylene or a derivative thereof, polyphenylene sulfide, polyetheretherketone, poly(para phenylene benzobismidazole) poly(para phenylene benzobisoxazole), poly (para phenylene benzobismidazole), poly(para phenylene benzobisthiazole), a polyimide, polyimide siloxane, vinyle ethers, polyphenyl, parylene-n, parylene-f, or benzocyclobutene.

The sacrificial layer may be formed of any other material used in prior art, such as zinc oxide (ZnO). However, the use of a metal or a polymer is preferred as described previously.

Figure 7:
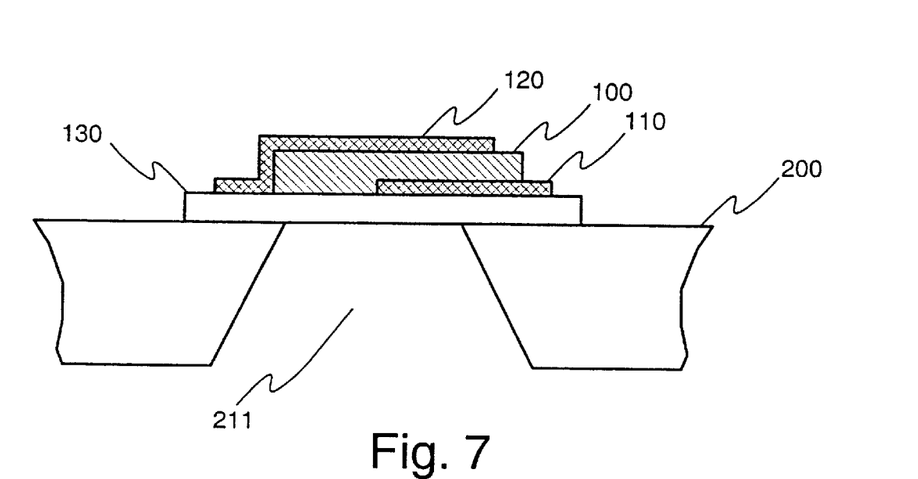
FIG. 7 illustrates a bulk acoustic wave resonator having a via-hole structure.

In the via-hole structure, the resonator is acoustically isolated from the substrate by etching away the substrate from under a major portion of the BAW resonator structure. FIG. 7 illustrates a via-hole structure of a BAW resonator. FIG. 7 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprise several layers having a thickness of one quarter wavelength at the center frequency, alternating layers having differing acoustical impedances. The number of layers in an acoustic mirror is an odd integer, typically ranging from three to nine. The ratio of acoustic impedance of two consecutive layers should be large in order to present as low acoustic impedance as possible to the BAW resonator, instead of the relatively high impedance of the substrate material. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate.

The polymer layer may be comprised of any polymer material having a low loss characteristic and a low acoustic impedance. Preferably, the polymer material is such that it can withstand temperatures of at least 350° C., since relatively high temperatures may be achieved during deposition of other layers of the acoustical mirror structure and other structures. The polymer layer may be comprised of, by example, polyimide, cyclotene, a carbon-based material, a silicon-based material or any other suitable material.

Figure 8:
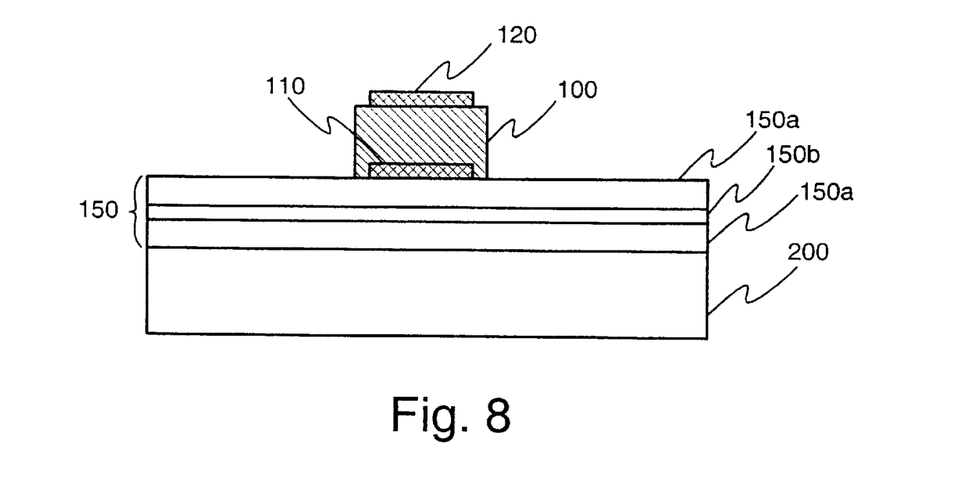
FIG. 8 illustrates a bulk acoustic wave resonator isolated from the substrate by an acoustic mirror structure.

FIG. 8 shows an example of a BAW resonator on top of an acoustical mirror structure. FIG. 8 shows the substrate 200, the bottom electrode 110, the piezoelectric layer 100, and the top electrode 120. The acoustical mirror structure 150 comprises in this example three layers 150a, 150b. Two of the layers 150a are formed of a first material, and the third layer 150b in between the two layers is formed from a second material. The first and second materials have different acoustical impedances as described previously. The order of the materials can be different in different embodiments of the invention. In some embodiments of the invention, the material with a high acoustical impedance can be in the middle and the material with a low acoustical impedance on both sides of the middle material. In other embodiments of the invention, the order can be opposite. The bottom electrode may in some embodiments of the invention function as one layer of the acoustical mirror.

Figure 9:
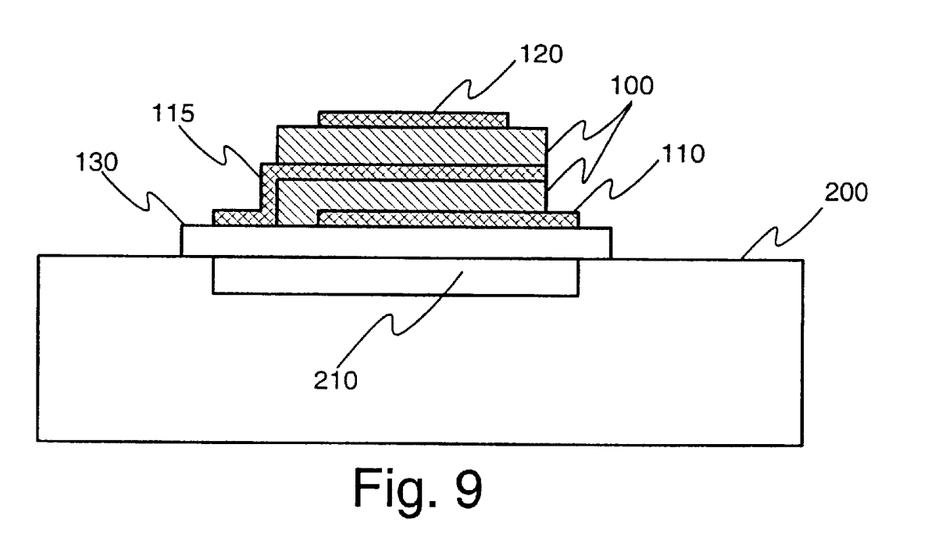
FIG. 9 illustrates a bulk acoustic wave resonator having a stacked structure.

FIG. 9 shows a further BAW resonator structure which may be used in an advantageous embodiment of the invention. FIG. 9 shows a stacked resonator structure having two piezoelectric layers 100. In addition to the bottom 110 and top 120 electrodes, a stacked structure requires a middle electrode 115, which is connected to ground potential. FIG. 9 further shows the membrane layer 130, the substrate 200 and the etch pit 210 isolating the structure from the substrate.

Figure 10:
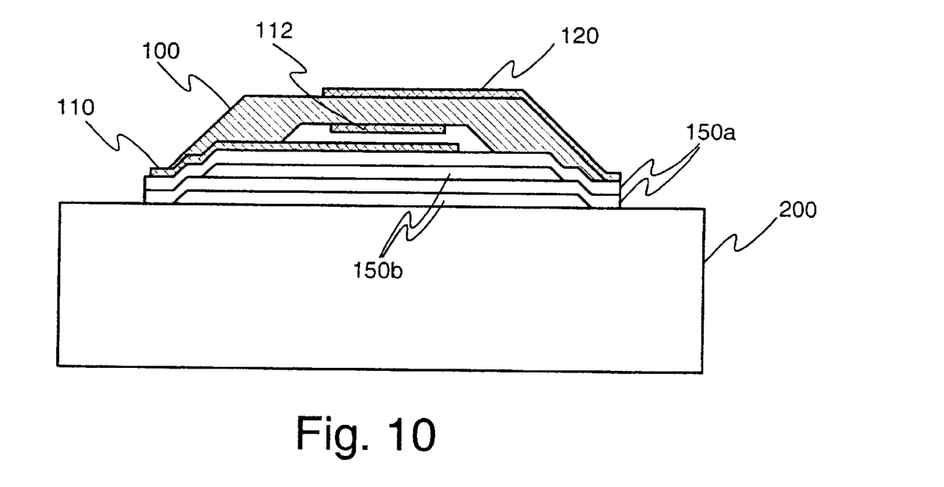
FIG. 10 illustrates a combined switch and resonator structure according to an advantageous embodiment of the invention, where the piezoelectric layer is the bending element.
Figure 11:
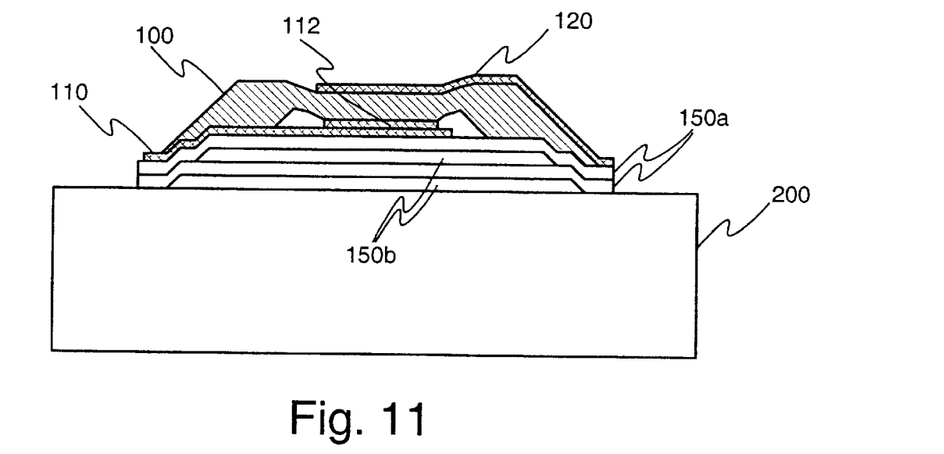
FIG. 11 illustrates the structure of FIG. 10 in the ON state.

FIG. 10 shows a sectional view of an advantageous embodiment of the invention in the OFF state, and FIG. 11 the same structure in ON state. This embodiment comprises a layer of piezoelectric material 100 forming a bridge structure, a first conductor 110 and a second conductor 120 for applying the DC control voltage and for feeding the RF signal to the piezoelectric layer 100, a contacting conductor 112, a substrate 200, and an acoustic mirror structure 150a, 150b for isolating the BAW structure 100,120,112,110 from the substrate 200. FIG. 10 shows the resonator and switch structure in the OFF state. When a sufficiently high voltage is applied between the top 120 and bottom 110 conductors, resulting electrostatic forces cause the piezoelectric layer to bend as shown in FIG. 11. The bending of the piezoelectric layer 100 brings the contacting conductor 112 into contact with the bottom electrode 110 as shown in FIG. 11. When the contacting conductor 112 is in contact with the bottom electrode 110, the structure is able to function as a resonator.

FIGS. 10 and 11 as well as all other figures in this specification showing sectional views of various structures are intended for illustrative purposes only, and may have exaggerated dimensions in one or more directions.

Figure 12:
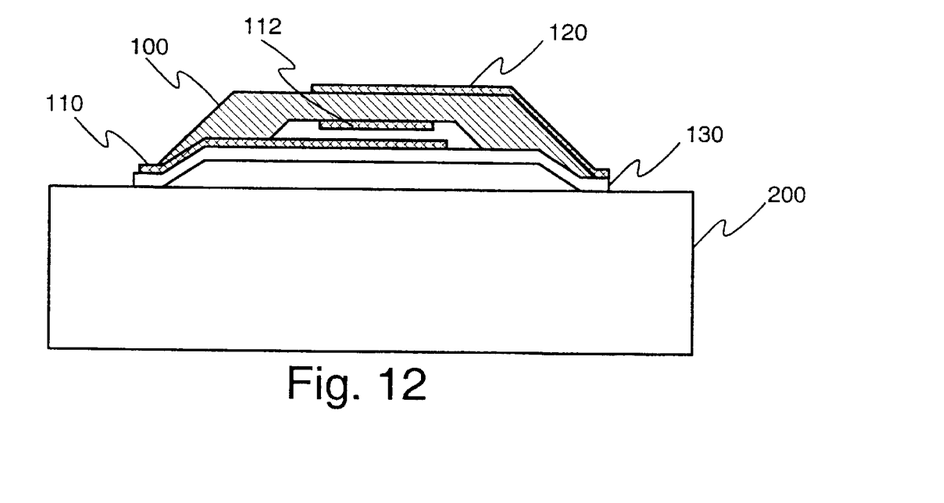
FIG. 12 illustrates another combined switch and resonator structure according to an advantageous embodiment of the invention.

FIG. 12 illustrates a further advantageous embodiment of the invention. In this embodiment, the switch and resonator structure 100,110,112,120 is acoustically isolated from the substrate 200 by a bridge structure formed by a membrane layer 130 instead of an acoustical mirror structure 150a, 150b. The switch and resonator structure 100,110,112,120 of the embodiment of FIG. 12 functions in the same way as the embodiment of FIGS. 10 and 11, wherefore the functional description is not repeated here.

Figure 13:
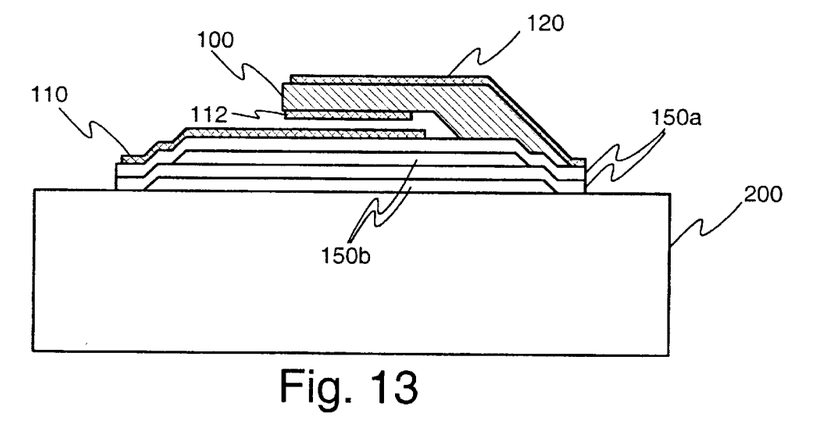
FIG. 13 illustrates a combined switch and resonator structure according to an advantageous embodiment of the invention, where the resonating element is fixed to the rest of the structure at one end only.

FIG. 13 illustrates a further advantageous embodiment of the invention, where the piezoelectric layer forms a cantilever structure instead of a bridge structure as shown in FIGS. 10, 11, and 12. One end of the cantilever 100 is fixed to the other layers, and the other end is free to move. The resonator and switch structure is shown in the OFF state in FIG. 13. When a sufficiently high voltage is applied between the top 120 and bottom 110 conductors, resulting electrostatic forces cause the piezoelectric layer to bend bringing the contacting conductor 112 into contact with the bottom electrode 110. When the contacting conductor 112 is in contact with the bottom electrode 110, the structure is able to function as a resonator. FIG. 13 further shows an acoustical isolation structure 150a,150b which isolates the resonator and switch structure 100,110,112,120 acoustically from the substrate 200.

Figure 14:
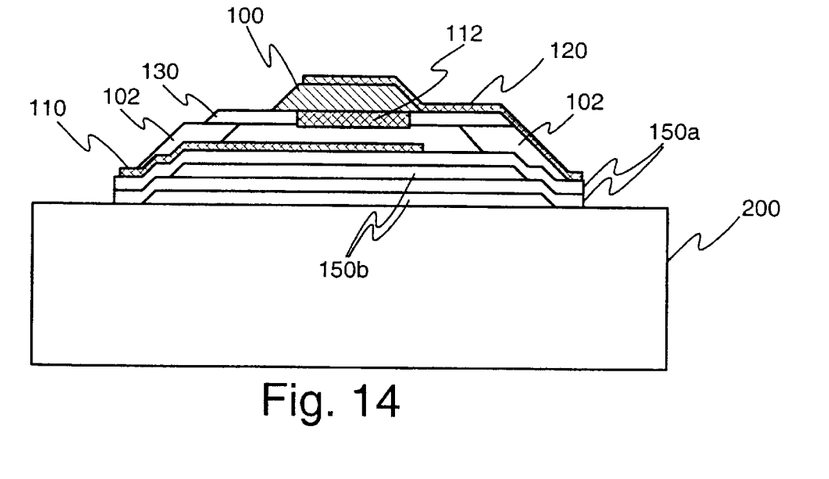
FIG. 14 illustrates a combined switch and resonator structure according to an advantageous embodiment of the invention, where a supporting layer is the bending element.

FIG. 14 shows a further advantageous embodiment of the invention, in which some other layer than the piezoelectric layer 100 is arranged to bend. The piezoelectric layer is deposited on a support layer 130, which in turn is supported by support structures 102. The resonator and switch structure is shown in the OFF state in FIG. 14. When a sufficiently high voltage is applied between the top 120 and bottom 110 conductors, resulting electrostatic forces cause the membrane layer 130 to bend bringing the contacting conductor 112 into contact with the bottom electrode 110. When the contacting conductor 112 is in contact with the bottom electrode 110, the structure is able to function as a resonator. FIG. 14 further shows an acoustical isolation structure 150a, 150b which isolates the resonator and switch structure 100,110,112,120 acoustically from the substrate 200. FIG. 14 shows that the support structures 102 and the support layer 130 are separate layers. However, in other embodiments of the invention, the support structures 102 and the support layer 130 may be a part of a single layer.

In a further advantageous embodiment of the invention having a structure resembling that shown in FIG. 14, the contacting conductor 112 forms the supporting and bending layer, which carries the piezoelectric layer 100. In such an embodiment, an isolation layer needs to be deposited between the contacting conductor 112 and the top electrode layer 120.

Figure 15:
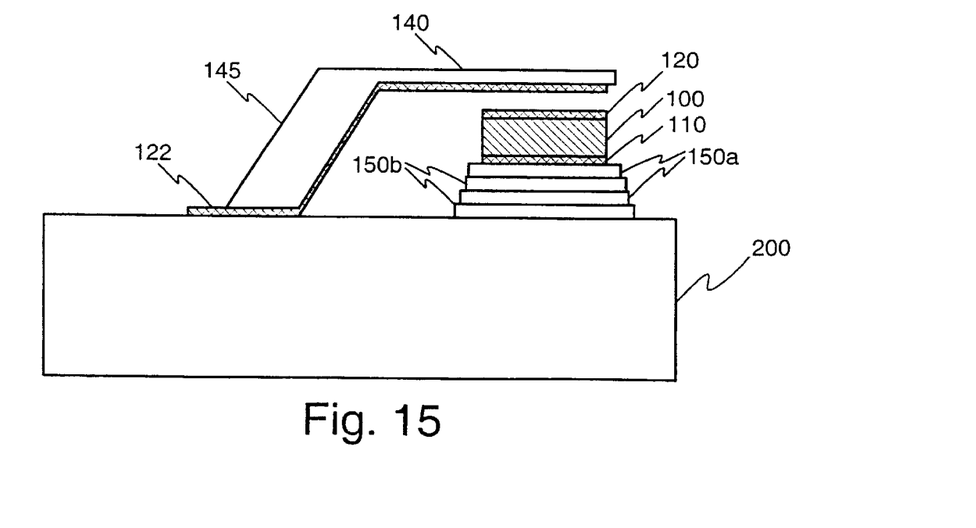
FIG. 15 illustrates a combined switch and resonator structure according to an advantageous embodiment of the invention, where a cantilever element is the bending element.

In some embodiments of the invention, the resonator element does not move when actuating the switch function of the combined structure. Such embodiments are especially advantageous when using a stacked resonator structure, such as for example the one shown in FIG. 9. FIG. 15 shows an example of such an embodiment. The embodiment of FIG. 15 comprises a piezoelectric layer 100 with top 120 and bottom 110 electrodes on top of an acoustic mirror structure 150a, 150b. FIG. 15 further shows a switch element comprising a cantilever support 145 and a switch cantilever 140. The switch element comprises further a contacting conductor 122. When a sufficiently high voltage is applied between the contacting conductor 122 and the bottom electrode 110, resulting electrostatic forces cause the cantilever 140 to bend bringing the contacting conductor 122 into contact with the top electrode 120. When the contacting conductor 122 is in contact with the top electrode 120, the structure is able to function as a resonator.

In a further advantageous embodiment of the invention, a switch element can be used to render the BAW element into the OFF state. In such an embodiment, when no voltage is applied to the switch element, wherefore the switch element is not bent to touch the BAW element, the BAW element is able to function freely, i.e. is in the ON state. When a voltage is applied to the switch element to bend the switch cantilever down to touch the BAW element, the cantilever dampens the oscillation of the BAW element. or at least moves the resonance frequency of the BAW element far from the operating frequency, which effectively renders the BAW element in a non-functioning i.e. OFF state. In such an embodiment, the top electrode 120 is preferably covered with a passivation layer to insulate the BAW element from the switch electrode voltage. In other respects such an embodiment may for example have a structure similar to that shown in FIG. 15.

The structure of FIG. 15 is only one example of resonator structures having a switch element 140,145 for example as shown in FIG. 15. Other types of BAW resonators can be used in other inventive embodiments having a switch element. For example, the BAW resonator can in some embodiments be acoustically isolated from the substrate by a bridge structure instead of an acoustical mirror structure as shown in FIG. 15.

Figure 16:
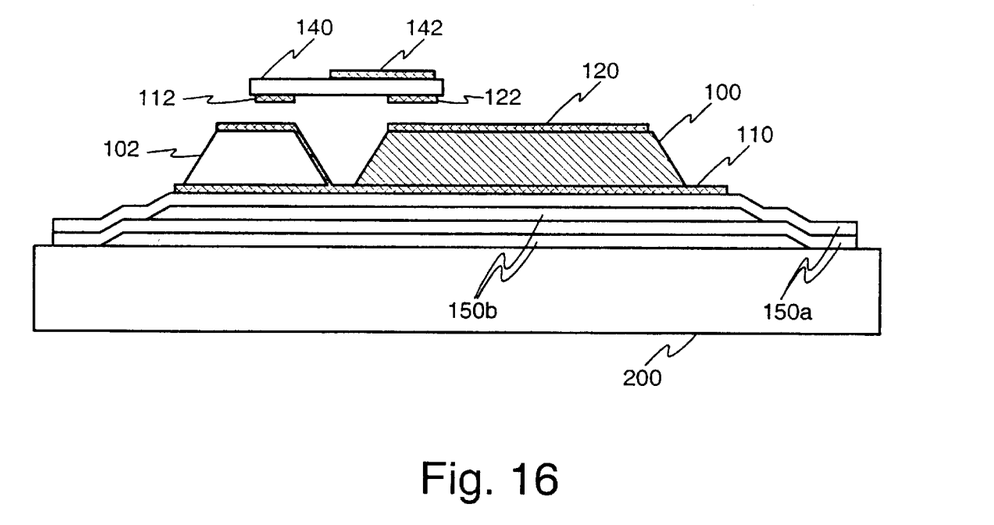
FIG. 16 illustrates an embodiment of the invention having a double switch structure.

FIG. 16 illustrates an advantageous embodiment of the invention, in which the structure realizes switches at both ports of the BAW element. In the embodiment of FIG. 16, a single switch element contacts both the top and the bottom electrode conductors in the ON state, and neither of them in the OFF state. FIG. 16 shows a sectional view of such a structure. The structure comprises a piezoelectric layer on top of a bottom electrode 110 and acoustic mirror 150a,150b layers. The structure further comprises a support structure 102, which brings an extension of the bottom electrode 110 to a location, where a switch element 140,142,112,122 is able to contact the bottom electrode. FIG. 16 shows the cantilever element 140 of a micromechanical switch structure. The micromechanical switch structure may for example have a structure similar to that shown in FIG. 15. The switch structure comprises conductors 112,122 for contacting the RF signal paths to the BAW element 100, 110,120, and a control voltage conductor 142 for application of the high DC voltage for actuating the switch element. The switching function is then actuated by applying a high DC voltage between the control voltage conductor and the bottom conductor 110, causing the cantilever element 140 to bend towards the bottom conductor, resulting in contact of the bottom electrode 110 and the corresponding contacting conductor 112 as well as in contact of the top electrode 120 and the corresponding contacting conductor 122.

The support structure 102 may advantageously consist of the same piezoelectric material as the piezoelectric layer 100, whereby they can be manufactured in the same processing step on top of the conductive layer forming the bottom electrode 110. The part of the conductor forming the bottom electrode 110 which extends on top of the support structure 102 may advantageously be deposited at the same time as the top electrode layer 120. By forming the support structure 102 this way, the support structure and the piezoelectric layer 100 have the same height, which simplifies the construction of the switch element.

FIG. 16 is only an example of an embodiment of the invention having a double switch structure, and is not intended to limit the structures of various embodiments having a double switch structures in any way.

In the previous examples, the bending movement of the cantilever 140, support layer 130 or the piezoelectric layer 100 has been shown as to be directed towards the substrate 200. However, the invention is not limited to a bending movement towards the substrate. In further advantageous embodiments of the invention, the bending movement can be directed away from the substrate. For example, in one advantageous embodiment of the invention, the BAW resonator is realized as a bridge structure, and the cantilever of a switch element is positioned between the BAW resonator and the substrate, from which position the cantilever may bend away from the substrate to contact the bottom conductor of the BAW resonator. In another advantageous embodiment of the invention, the BAW resonator is arranged to bend away from the substrate to contact a conductor carried by a bridge structure above the BAW resonator.

As the previous examples show, the implementation of various features of a structure according to the invention can be varied in many ways. For example, the resonator can be fixed to the rest of the structure from one or more locations. The bending element may be the resonator itself, a member carrying the resonator, or a separate cantilever, and the bending may proceed in many different directions. Further, the structure may realize one or more switches.

For clarity, any passivation layers commonly needed for manufacturing microelectronic and micromechanical structures are not drawn in the figures of this specification.

In such an embodiment, in which the substrate is made of silicon (Si), gallium arsenide (GaAs) or some other material suitable for use as a substrate for integrated circuits, also other elements such as transistors can be realized on the same substrate. For example, other circuits such as amplifiers can be integrated on the same substrate, which allows integration of nearly all RF components of a mobile communication means on a single substrate.

Figure 17:
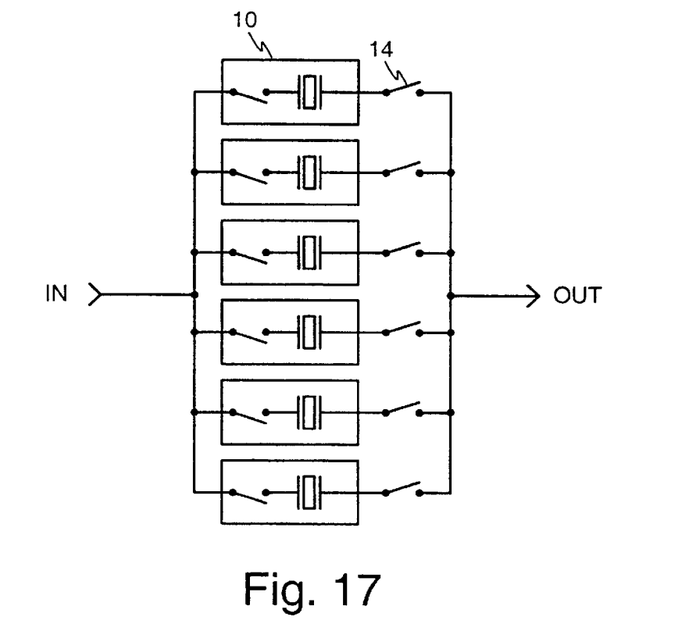
FIG. 17 illustrates a filter bank structure using resonator and switch structures according to the invention.

The resonator and switch structures according to the invention can be used, for example, to realize switched filter banks. One possible application of a switched filter bank according to the invention is shown in FIG. 17. The embodiment of FIG. 17 can be used for example in filtering of a narrow part of a transmission or a receiving band. The filter bank comprises several passband filters having relatively narrow passbands, whereby a portion of a band can be selected for operation by switching the filter with the desired center frequency into use. The passband filters are realized using a resonator and switch structure 10 according to the invention. The switches of the resonator and switch structures 10 are used to select which filter is used. Since the passbands of adjacent filters overlap each other to some extent, it is very difficult to match the filters at the second filter port if all the other filters, i.e. unused filters, are connected to the other port causing loading of the second port. The unused filters would present a frequency dependent reactance, which is seen as shunt reactance at the second port. This problem can be solved by using a second switch 14 to each filter, as is shown in FIG. 17. In such applications, where the passbands of the filters are relatively far apart, the switches at the second ports, i.e. output ports of the filters, may not be needed. In a further advantageous embodiment of the invention, structures incorporating a BAW element and a double switch structure may be used in a switched filter bank, eliminating the need for a separate switch 14 for each filter element. Such structures having a double switch structure may for example be realized according to the embodiment of the invention described in conjunction with FIG. 16.

The filter bank structure of FIG. 17 can be used to limit the noise and disturbing signals which the receiver receives from a single receiving band. At the transmission side, such a filter bank can clean up noise generated by the transmission circuitry outside the desired transmission frequencies.

A filter bank can comprise one or more filters in various embodiments of the invention. FIG. 17 shows an example only. For clarity, the DC signal lines for applying the control voltages to the combined switch and filter structures 10 are not shown in FIG. 17.

Figure 18:
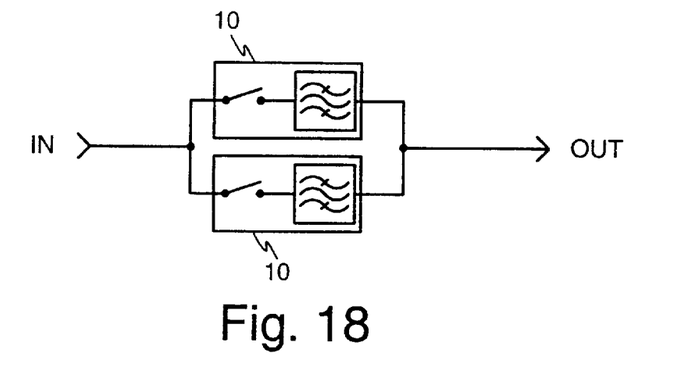
FIG. 18 illustrates another filter bank structure using resonator and switch structures according to the invention.

In an another advantageous embodiment of the invention, a filter bank can be used to select between different operating bands, for example in a mobile communication means, which is arranged to communicate with more than one network having differing operating bands. FIG. 18 shows a structure according to such an embodiment. The structure of FIG. 18 comprises two switch and filter structures 10. In FIG. 18, switches are used only at the input port of the filters. In this example, the passbands of the two filters are sufficiently far apart, that the shunt reactance presented to the output port of the filter in use does not affect the passband of the filter in use too much. The switches at the input port of the filters are used to select the desired filter. The arrangement shown in FIG. 18 can be used in a receiver structure as well as in a transmitter structure. For clarity, the DC signal lines for applying the control voltages to the combined switch and filter structures 10 are not shown in FIG. 18.

Figure 19A:
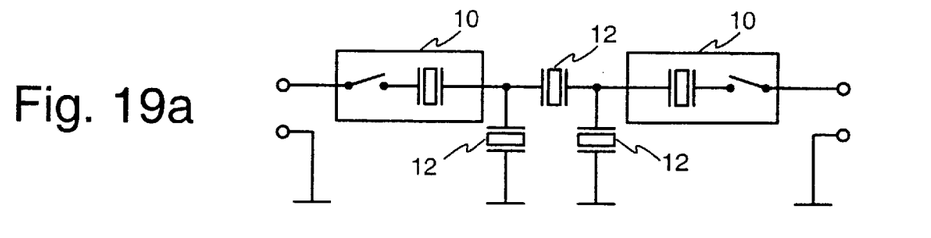
FIG. 19a, 19b, and 19c illustrate various filter structures obtainable with various advantageous embodiments of the invention.
Figure 19B:
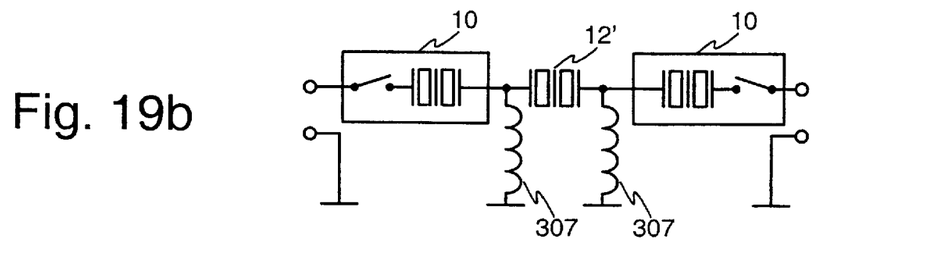
Figure 19C:
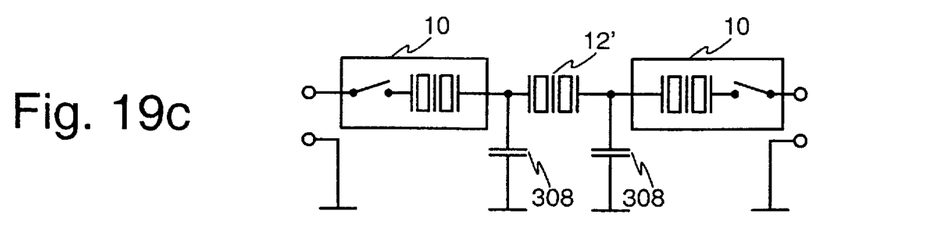

Filters that utilize bulk acoustic wave resonators can comprise more than one resonator. FIGS. 19a, 19b, and 19c show various filter structures having switches at both filter ports, which filter structures can be used in various embodiments of the invention. FIG. 19a shows an example of a resonator and switch structure, which comprises in addition to combined resonator and switch structures, also conventional BAW resonators 12 having a single piezoelectric layer. Using several resonators in a ladder topology as shown in FIG. 19a provides in most cases better filtering properties than using a single resonator only. FIG. 19b shows a filter structure constructed with stacked bulk acoustic wave resonators 12' and combined resonator and switch structures 10 having a stacked resonator structure. The filter comprises series coupled resonators 12' with shunt inductors 307 between the resonators. FIG. 19c shows a filter structure adapted for narrow bandwith operation. The structure is otherwise similar to the structure of FIG. 19b, but instead of shunt inductors, shunt capacitors 308 are used. The structures of FIGS. 19a, 19b, and 19c can be used, for example, in switched filter bank structures such as those shown in FIGS. 17 and 18. For clarity, the DC signal lines for applying the control voltages to the combined switch and filter structures 10 are not shown in FIGS. 19a, 19b, and 19c.

Figure 20:
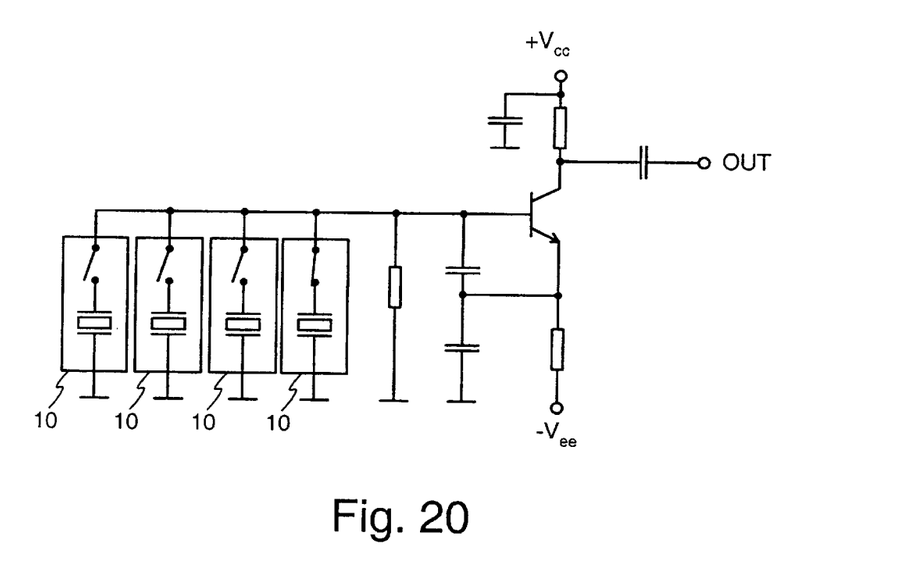
FIG. 20 illustrates the use of combined bulk acoustic wave resonator and switch structures according to the invention in oscillators.

FIG. 20 shows a further advantageous embodiment of the invention. FIG. 20 illustrates an oscillator circuit of the well known Colpitts type. A bulk acoustic wave resonator and switch bank comprising swich and bulk acoustic wave resonator structures 10 is used for providing several operation frequencies for the oscillator circuit. The desired operating frequency is selected by selecting the corresponding resonator with one of the switches. This kind of an oscillator structure can advantageously be used, for example, in a multi-band mobile communication means. For clarity, signal lines which control the position of switches are not drawn in FIG. 20. Resonator and switch structures according to the invention can be used also in many other oscillator structures, and FIG. 20 is shown as an example only. Since a Colpitts oscillator is well known by the man skilled in the art, the functioning and the structure of the oscillator in FIG. 20 is not described here in further detail. For clarity, the DC signal lines for applying the control voltages to the combined switch and filter structures 10 are not shown in FIG. 20.

Figure 21:
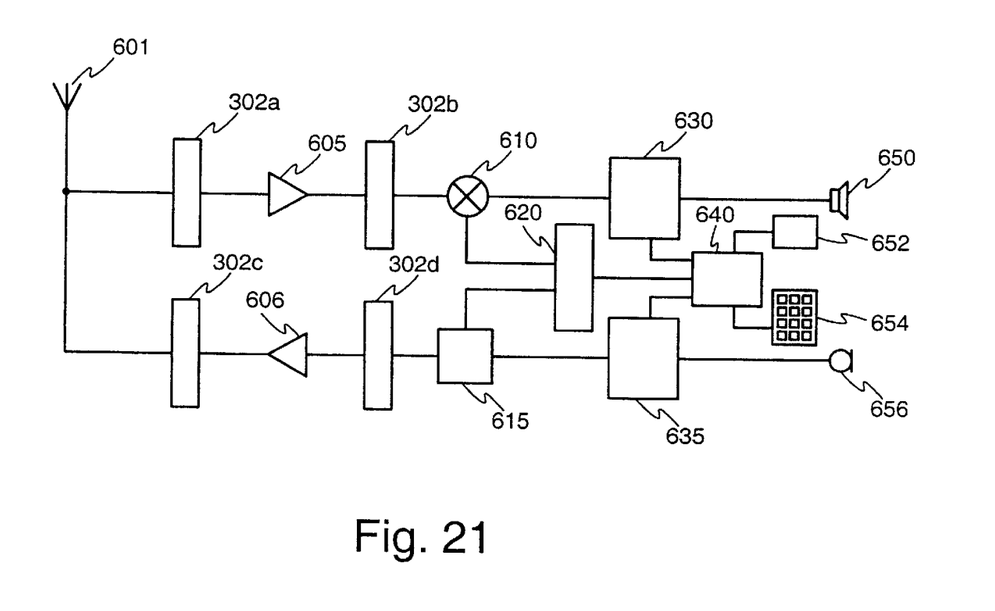
FIG. 21 illustrates the use of switched resonator banks in a mobile communication means according to the invention.

In FIG. 21, a block diagram of a mobile communication means according to a further advantageous embodiment of the invention is shown. The receiver part of the mobile communication means comprises a first receiver switched filter bank 302a for filtering the received signal, a receiver amplifier 605 for amplifying the received signal, a second receiver switched filter bank 302b for further filtering of the received signal, a mixer 610 for converting the received signal to baseband, a receiver block 630 for demodulating and decoding the signal and an earpiece 650 or a loudspeaker 650 for producing the audible received signal. The transmitter part comprises a microphone 656, a transmitter block 635 for coding the signal to be transmitted and performing other necessary signal processing, a modulator 615 for producing the modulated radio frequency signal, a first transmitter switched filter bank 302d, a transmitter amplifier 606, and a second transmitter switched filter bank 302c. The mobile communication means further comprises an antenna 601, an oscillator block 620, a control block 640, a display 652 and a keypad 654. The control block 640 controls the functioning of the receiver and transmitter blocks and the oscillator block, as well as displays information to the user via the display 652 and receives commands from the user via the keypad 654. The switched filter banks 302a, 302b, 302c, and 302d can have, for example, the structure shown in FIG. 17 or the structure shown in FIG. 18, or a structure which is a combination of the structures in FIGS. 17 and 18, depending on the width and the number of the operating bands of the mobile communication means. Other structures can also be used for the switched filter banks 302a, 302b, 302c, and 302d. The receiver switched filter banks 302a, 302b are used to limit the noise and disturbing signals which the receiver receives from a receiving band. At the transmission side, the transmission switched filter banks 302c, 302d can clean up noise generated by the transmission circuitry outside the desired transmission frequencies. The oscillator block 620 may comprise an oscillator with a switched resonator bank, for example such as shown in FIG. 20. The oscillator block 620 may further comprise a switched filter block for removing unwanted noise from the output of the oscillator circuit.

In further advantageous embodiments of the invention, combined resonator and switch structures are used in other types of small radio transmitter and/or receiver structures, where a small size of the components of the device is desired. For example, combined resonator and switch structures can advantageously be used in in-building base stations of cordless telecommunications systems, such as cellular telecommunications systems or other types of cordless telephone systems. Further, combined resonator and switch structures can advantageously be used for example in embedded radio link units in portable computers, personal digital assistants, and remote controlled devices.

According to a further advantageous embodiment of the invention, the substrate on which the resonator and switching means are deposited is used as a substrate, on which other components are attached. For example, the substrate may provide wiring connections for other components, which wiring connections are realized as electrically conducting patterns on the substrate surface. Components such as integrated circuits can subsequently be bonded on the substrate. For example, unpackaged integrated circuits can be bonded directly on the substrate using flipchip bonding technique. Such an embodiment is especially advantageous, when glass is used as the substrate material, since the low cost of glass substrates allow relatively large substrates to be produced, whereby such substrates can accommodate other components in addition to the deposited resonator and switch structures.

Resonator and switch structures according to the invention are advantageously used at frequencies roughly at or higher than 400 MHz, i.e. at frequencies where BAW resonators are feasible.

The invention provides combined resonator and switch structures, which are economical to produce, since such structures can be produced in a single fabrication process. The invention further allows the production of complicated switched resonator and filter structures having a very small size, which is a substantial advantage in constructing multi-system mobile communication means.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention.

What is claimed is:

1. A resonator structure comprising a resonator having a piezoelectric layer, wherein the resonator structure comprises:
    a first conductor and a second conductor for conducting a control voltage,
    at least one of said first and second conductors being in contact with said piezoelectric layer for forming an electrode of the resonator, and
    a bending element for performing a switching function as a response to a control voltage applied to said first and second conductors.

2. A resonator structure according to claim 1, characterized in that the piezoelectric layer is said bending element.

3. A resonator structure according to claim 1, characterized in that the structure comprises a supporting layer for supporting said piezoelectric layer, said supporting layer being said bending element.

4. A resonator structure according to claim 1, characterized in that the resonator structure comprises a cantilever element said cantilever element being said bending element.

5. A resonator structure according to claim 1, characterized in that said resonator is a bulk acoustic wave resonator.

6. A resonator structure according to claim 1, characterized in that the resonator structure comprises at least one filter.

7. Mobile communication means, characterized in that the mobile communication means comprises a resonator structure, which resonator structure comprises
    a first conductor and a second conductor for conducting a switch function control voltage,
    at least one of said first and second conductors being in contact with said piezoelectric layer for forming an electrode of the resonator,
    a bending element for performing the switching function as a response to a control voltage applied to said first and second conductors.

* * * * *